United States Patent
Dasgupta

[11] Patent Number: 6,146,939
[45] Date of Patent: Nov. 14, 2000

[54] METAL-POLYCRYSTALLINE SILICON-N-WELL MULTIPLE LAYERED CAPACITOR

[75] Inventor: Uday Dasgupta, Singapore, Singapore

[73] Assignee: Tritech Microelectronics, Ltd., Singapore, Singapore

[21] Appl. No.: 09/156,358

[22] Filed: Sep. 18, 1998

[51] Int. Cl.[7] ...................... H01L 21/8242; H01L 21/20; H01L 27/108

[52] U.S. Cl. ........................ 438/251; 438/253; 438/239; 438/394; 257/306; 257/307

[58] Field of Search ................................... 438/239, 253, 438/381, 396, 256, 251, 394, 399; 257/306, 307

[56] References Cited

U.S. PATENT DOCUMENTS

| | | | |
|---|---|---|---|
| 4,377,029 | 3/1983 | Ozawa | 29/576 B |
| 4,700,457 | 10/1987 | Matsukawa | 437/52 |
| 4,914,497 | 4/1990 | Kondo | 357/51 |
| 5,021,920 | 6/1991 | Smith | 361/311 |
| 5,108,941 | 4/1992 | Paterson et la. | 437/47 |
| 5,130,267 | 7/1992 | Kaya et al. | 437/47 |
| 5,166,858 | 11/1992 | Frake et al. | 361/313 |
| 5,744,385 | 4/1998 | Hojabri | 438/238 |
| 5,874,770 | 2/1999 | Saia et al. | 257/536 |
| 6,063,659 | 5/2000 | Le | 438/250 |
| 6,066,537 | 5/2000 | Poh | 438/393 |

*Primary Examiner*—Matthew Smith
*Assistant Examiner*—Lex H. Malsawma
*Attorney, Agent, or Firm*—George O. Saile; Stephens B. Ackerman; Billy Knowles

[57] ABSTRACT

A stacked capacitor that has a large capacitance per unit area (Co), very low voltage coefficient (Kv), and an acceptable parasitic capacitance factor (Kp) is described that uses only one polysilicon layer. The stacked capacitor is formed at the surface of a semiconductor substrate of a first conductivity type. The stacked capacitor has a bottom plate that is formed by a lightly doped well diffused into the surface of the semiconductor substrate. The bottom plate also has a first plurality of interconnected conductive layers of a first conductive material disposed above and aligned with the well, whereby a first conductive layer of the first plurality of conductive layers is connected to the well by multiple contacts distributed over an area of the well. The stacked capacitor further has a top plate with a second conductive layer of a second conductive material such as a highly doped polycrystalline silicon placed between the well and the first conductive layer and has openings distributed over a surface area of the conductive material to allow the multiple contacts to connect the well and the first conductive layer. The top plate further has second plurality of interconnected conductive layers of the first conductive material connected to the second conductive layer and interleaved between each layer of the first plurality of conductive layers. Additionally the stacked capacitor has a dielectric having a plurality of insulating layers to electrically isolate each of the conductive layers from each other.

5 Claims, 5 Drawing Sheets

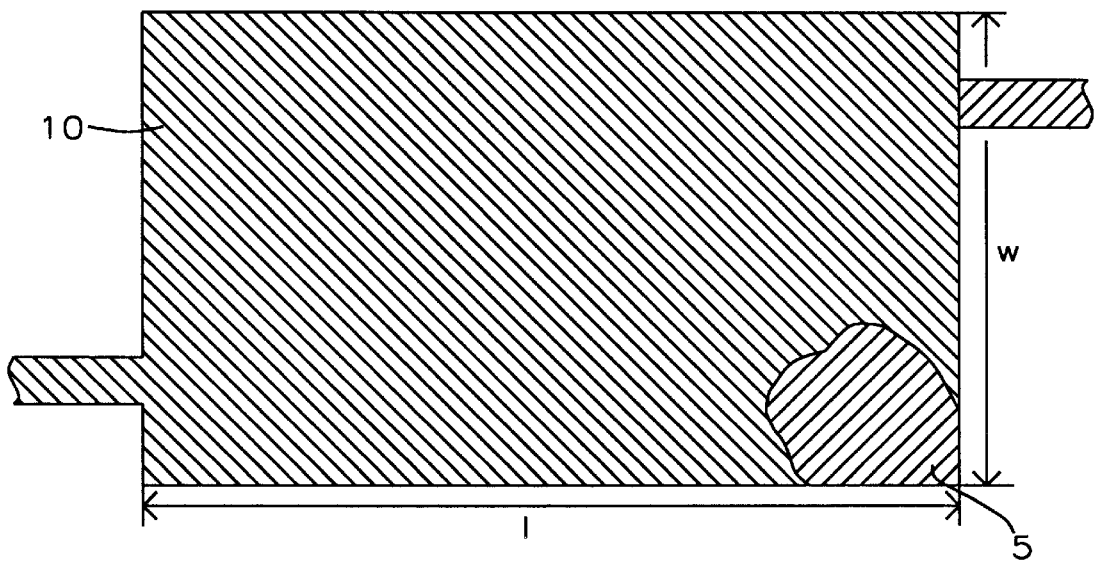
FIG. 1a — Prior Art
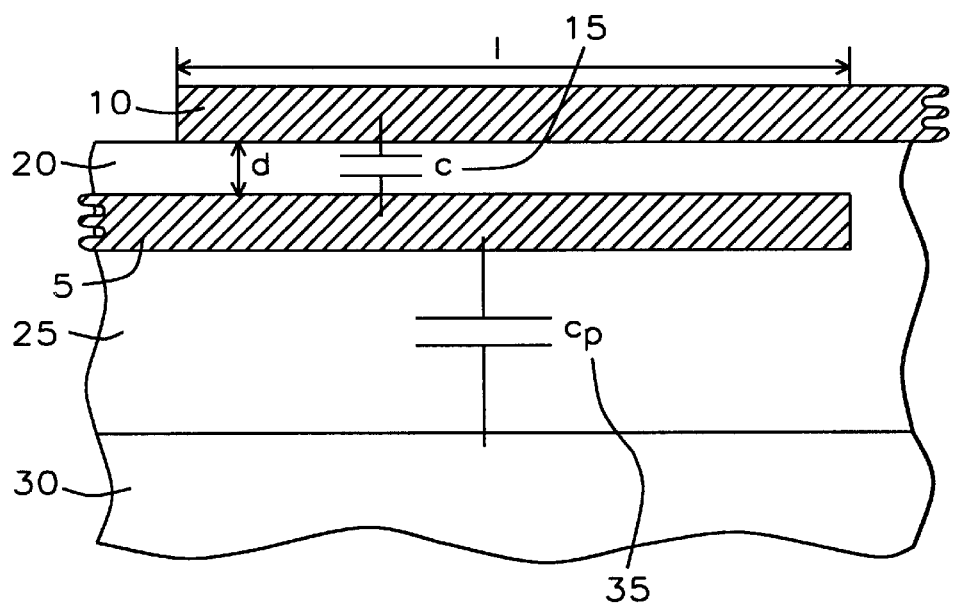
FIG. 1b — Prior Art

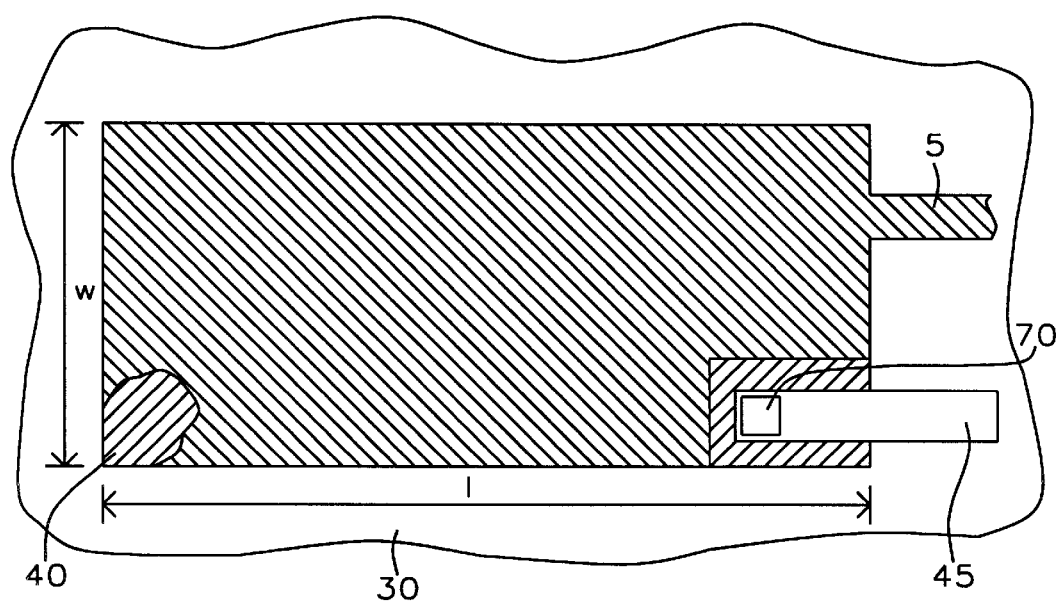
FIG. 1c – Prior Art
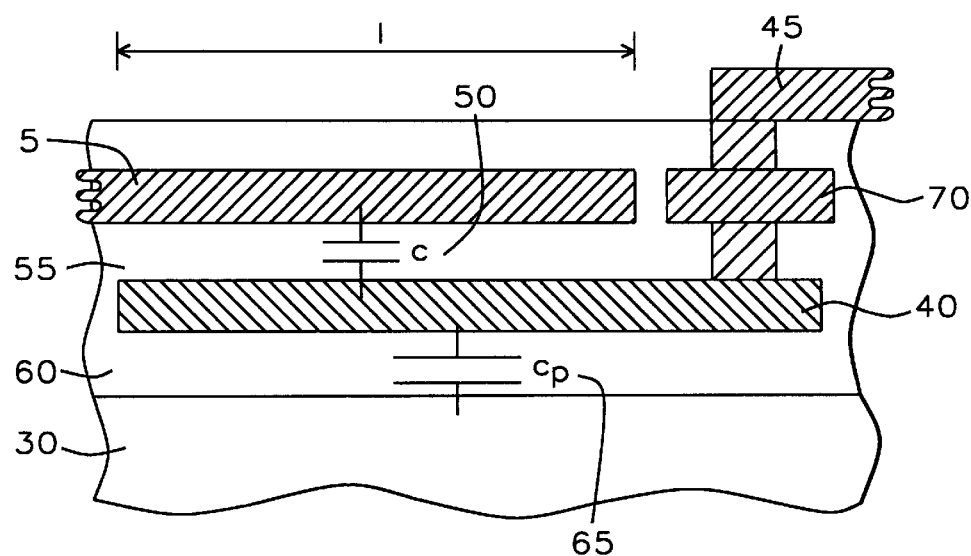
FIG. 1d – Prior Art

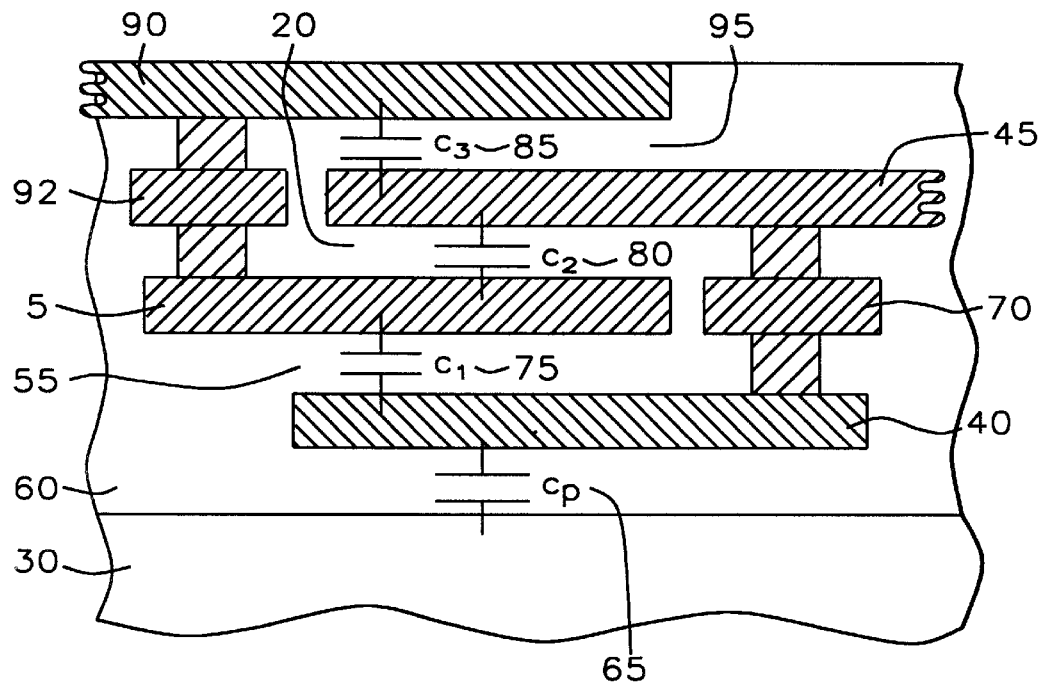
FIG. 1e – Prior Art
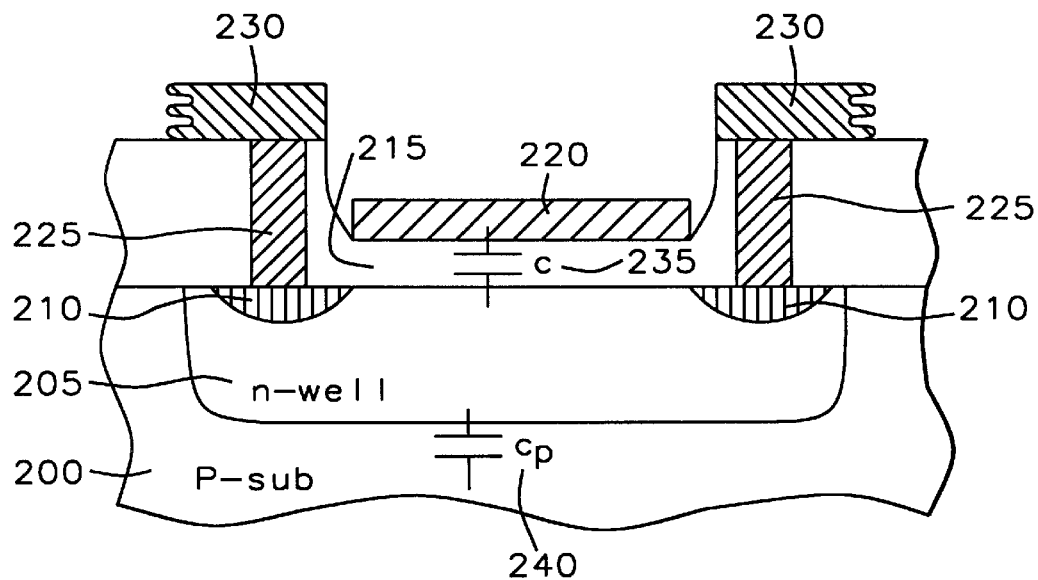
FIG. 2 – Prior Art

METAL-POLYCRYSTALLINE SILICON-N-WELL MULTIPLE LAYERED CAPACITOR

BACKGROUND OF THE INVENTION

1. Field of the Invention

This invention relates to circuit elements formed on the surface of a semiconductor substrate. More particularly this invention relates to capacitors formed on the surface of a semiconductor substrate.

2. Description of Related Art

The art for fabricating a capacitor within an integrated circuit is well known. A capacitor is formed when two conductive materials are separated by an insulator. The capacitance of such a structure is determined by the formula:

$$C = \frac{\varepsilon A}{d}$$

where:

A is the area of one of the conductive materials, $\varepsilon$ is the permitivity of the insulator, d is the thickness of the insulator.

FIGS. 1 $a$, 1$b$, 1$c$ and 1$d$ illustrate the structure of a metal to metal and a metal to a highly doped polycrystalline silicon capacitor. For a metal to metal capacitor, as shown in FIGS. 1$a$ and 1$b$, a layer 25 of an insulating material such as silicon dioxide is formed (grown or deposited) on the surface of the semiconductor substrate 30. A layer of the first level metal 5 is placed on the insulating layer 25. A second insulating layer 20 is then formed on the surface of the first level metal 5. The thickness d of the second insulating layer 20 is typically from 460 nanometers to 690 nanometers. The insulating layer 20 is generally silicon dioxide, which has a permitivity of from approximately $3.54 \times 10^{-11}$ F/m to $4.43 \times 10^{-11}$ F/m. If the insulating layer is 1 $\mu$m thick (d) then the capacitance C 15 per unit area is from approximately 0.035 fF/$\mu$m$^2$ to approximately 0.043 fF/$\mu$m$^2$. The total capacitance C15 of the capacitor as shown is the area (l*w) of either the first level metal 5 or the second level metal 10 (whichever is less) multiplied by the capacitance C15.

Other materials such as silicon nitride (Si$_x$N$_y$), silicon oxynitride (Si$_x$O$_y$N$_z$), polyimide, or other insulating films may be substituted for the silicon dioxide described above.

Each capacitor formed as shown has a parasitic capacitor Cp 35. The parasitic capacitor Cp 35 is formed by the first level metal 5 and the semiconductor substrate 30. The dielectric of the parasitic capacitor Cp 35 is the first insulating layer 25. The parasitic capacitor Cp 35 typically has a capacitance of from approximately 0.08 fF/$\mu$m$^2$ to approximately 0.12 fF/$\mu$m$^2$.

FIGS. 1$c$ and 1$d$ show a capacitor C 50 having a heavily doped polycrystalline silicon layer 40 as the first plate and the first level metal 5 as the second plate. The capacitor is formed by growing or depositing an insulating material such as silicon dioxide to create the first insulating layer 60 on the surface of the semiconductor substrate 30. The heavily doped polycrystalline silicon layer 40 is deposited on the top of the first insulating layer.

The dielectric of the capacitor C 50 is formed by depositing a second insulating material, again silicon dioxide, on the heavily doped polycrystalline silicon layer 40. The second plate 5 is formed by depositing the first level metal on the surface of the second insulating layer 55. A via 70 is constructed to connect a second level metal layer 45 to the highly doped polycrystalline silicon layer 40.

As described above, a parasitic capacitor 65 is formed between the heavily doped polycrystalline silicon layer 40 and the substrate 30. The capacitance of the parasitic capacitor 65 typically is from 0.08 fF/$\mu$m$^2$ to 0.12 fF/$\mu$m$^2$.

The process of fabrication of the capacitors as shown in FIGS. 1$a$, 1$b$, 1$c$ and 1$d$ can be combined to form a stacked capacitor as shown in FIG. 1$e$. The first insulating layer 60 is formed on the semiconductor substrate 30. The heavily doped polycrystalline silicon layer 40 is formed as above described. The second insulating layer 55 is then formed, as described, on the heavily doped polycrystalline silicon layer 40. Multiple metal layers 5, 45 and 90 are formed having multiple insulating layers 20 and 95 between each of them. The via 70 connects the heavily doped polycrystalline silicon layer 40 to the second level metal layer 45. The via 92 connects the first level metal layer 5 to the third level metal layer 90. This creates a structure where the multiple metal layers 5, 45, and 90 and the highly doped polycrystalline silicon layer 40 are interleaved to form the stacked capacitor. The capacitor C1 75 is formed by the highly doped polycrystalline silicon layer 40 and the first level metal layer 5. The capacitor C2 80 is formed by the first and second level metal layers 5 and 45. The capacitor C3 85 is formed by the second and third level metal layers 45 and 90. The total capacitance of the stacked capacitor is the sum of the capacitors C1, C2, and C3.

As described in FIGS. 1$c$ and 1$d$, the parasitic capacitor Cp 65 is formed between the heavily doped polycrystalline silicon layer 40 and the semiconductor substrate 30.

Typically, in an integrated circuit design, the layer 40 that forms the parasitic capacitor Cp 65 is connected in a way so as to minimize the effect of the parasitic capacitor Cp 65. One example of this is connecting the layer 40 to the ground reference point such that both terminals of the parasitic capacitor Cp 65 are at an equal potential. Often the layer 40 that forms the parasitic capacitor Cp 65 with the semiconductor substrate 30 is termed the bottom plate of the capacitor and conversely the layers 5 and 90 not attached to the parasitic capacitor Cp 65 are connected to the more noise sensitive nodes of an integrated circuit and are termed the top plate of the capacitor. In some applications of the capacitor, it can not be connected as above described. In such cases one will have to take the effect of the parasitic capacitor Cp 65 in account. The lower the value of the parasitic capacitor Cp 65, when compared to the capacitance per unit area Co, the less impact the parasitic capacitor Cp 65 has on the design of the stacked capacitor.

Table 1. shows the designation of the top plate, bottom plate, the capacitance per unit area Co of the structure, and the parasitic capacitance factor Kp.

TABLE 1

| Type | Top Plate | Bottom Plate | | $KP = \dfrac{Co}{cp}$ |
|---|---|---|---|---|
| Metal 1/ Metal 2 (FIG. 1a/1b) | Metal 2 | Metal 1 | 0.04 fF/$\mu$m$^2$ | 0.4 |
| Metal 1/Poly (FIG. 1c/1d) | Metal 1 | Poly | 0.06 fF/$\mu$m$^2$ | 0.6 |
| Stacked Metal 1/ Metal 2/ Metal 3/Poly (FIG. 1e) | Metal 1/Metal 3 | Metal 2/Poly | 0.14 fF/$\mu$m$^2$ | 1.4 |

FIG. 2 illustrates a second method of fabricating a capacitor on a p-type semiconductor substrate 200. An n-type material is diffused to a lightly doped concentration into the p-type semiconductor substrate 200 to form the well 205. Heavily doped n-type material is further diffused into the p-type semiconductor substrate 200 within the well 205 to form the contact areas 210. The contact metalization 225 forms the connection between the well 205 and the first level metal layer 230. A thin insulating layer 215 is formed on the surface of the p-type semiconductor substrate 200 above the well 205. A heavily doped polycrystalline silicon layer 220 is formed on the thin insulating layer 215. The top plate capacitor C 235 is formed by the heavily doped polycrystalline silicon layer 220. The bottom plate of the capacitor C 235 is formed by the well 205 with the thin insulating layer 215 forming the dielectric of the capacitor C 235. The capacitance per unit area Co of the capacitor C 235 has a very high value that is approximately 4.8 fF/$\mu$m$^2$ for a typical 0.35 $\mu$m, because of the dielectric of the very thin insulating layer 215, between the plates 215 and 205. The capacitance per unit area Co of the capacitor C 235 has a range of from 4.3 fF/$\mu$m–5.3 fF/$\mu$m$^2$ for the 0.35 $\mu$m process.

A parasitic capacitor Cp 240 is the junction capacitance between the well 205 and the substrate 200, which is typically 0.24 fF/$\mu$m$^2$. In the capacitor structure, as shown, the parasitic capacitance factor Kp is 20.0, this is considered a very good value.

As a voltage is placed across a capacitor, the shifting of the charges from one plate to the other can deplete the available charges from the plate having the most negative voltage. This depletion of the charges makes the capacitance value a function Kv of the voltage applied across the capacitor. Metal layers and highly doped polycrystalline silicon layers have sufficient charges available in their structure that the voltage at which depletion becomes a factor is much larger than the breakdown voltage of the dielectric between the layers. Usually the n-well 205 is lightly doped because of other constraints. Unfortunately, the lightly doped n-well 205 becomes depleted of charges at a much lower voltage than the voltage level of the power supply voltage source, because of the very thin dielectric. This results in a very large voltage function Kv.

U.S. Pat. No. 5,108,941 (Paterson et al.) describes a method for forming a metal to polycrystalline silicon capacitor on a field oxide layer on a semiconductor substrate surface. After the formation of the patterned polycrystalline silicon layer, a multi-level dielectric is formed, and a via is etched there through to a polycrystalline silicon lower electrode. The capacitor dielectric such as an oxide/nitride layered dielectric is then deposited. Contacts are etched to a diffusion layer and to polycrystalline silicon electrodes as desired, and metal is deposited and patterned to form the top electrode of the capacitor over the capacitor dielectric, and to make contact as desired to diffusion and to polycrystalline silicon.

U.S. Pat. No. 4,914,497 (Kondo) discloses a semiconductor device with a metal-insulator semiconductor (MIS) capacitor. The MIS capacitor uses an oxidation-resist film for forming a field oxide film partly buried in a semiconductor substrate. The oxidation-resist film is created by means of the selective oxidation technique and is employed as a dielectric. A peripheral edge portion of the oxidation-resist film is turned up at a bird's-beak-shaped edge portion of the field oxide film, so that a gap space is produced between the peripheral edge portion of the oxidation-resist film and the bird's-beak-shaped edge portion of the field oxide film. An insulator layer is formed at the peripheral edge portion of the oxidation-resist film. An elongated upper conductor layer of the MIS capacitor is formed on the oxidation-resist film to form the top plate of the MIS capacitor.

U.S. Pat. No. 5,130,267 (Kaya et al.) teaches split metal plate capacitor with a polycrystalline silicon electrode as a bottom plate and a split metal layer as a top plate. Subsequent to the formation of a patterned polycrystalline silicon layer preferably silicide clad, the capacitor dielectric is deposited on the polycrystalline silicon layer. A first metal layer formed of a refractory metal (such as Mo, W, or Ti), alloy (titanium-tungsten) or compound (titanium nitride) is deposited over the capacitor dielectric. The first metal layer is patterned and etched to define the size of the metal the size of the polycrystalline silicon/silicide capacitor. Multilevel dielectric, such as phososilicate glass (PSG) or borophososilicate glass, is deposited over the first metal layer. A contact via is etched through the multilevel dielectric to the first metal layer. Contacts are etched at this same time to diffusion and to polycrystalline silicon electrodes as desired. A second metal layer is then deposited and patterned to contact the top plate of the capacitor over the capacitor dielectric, and to make contact as desired to the diffusion and to the polycrystalline silicon.

U.S. Pat. No. 4,377,029 (Ozawa) describes a process for fabricating a bipolar integrated circuit in which the insulation layer separating the diffusion layer connected to a lower part electrode of a capacitor from the upper electrode may be made thinner without causing short circuiting between the upper electrode and the lower electrode. Thus, the capacitance of the capacitor region may be increased and the packaging density of the integrated circuit may be improved.

SUMMARY OF THE INVENTION

An object of this invention is to provide a capacitor that has a large capacitance per unit area (Co).

Another object of this invention is to provide a capacitor that has a very low voltage coefficient (Kv) indicating a very high depletion voltage.

Further another object of this invention is to provide a capacitor that has a large capacitance per unit area (Co) with a very low voltage coefficient (Kv) indicating a very high depletion voltage in a process having a single polysilicon layer, Thus making this invention particularly useful for digital CMOS integrated circuit processes having only one polysilicon layer.

Still Further, another object of this invention is to provide a capacitor that has an acceptably low parasitic capacitance factor (Kp).

To accomplish these and other objects a stacked capacitor is formed at the surface of a semiconductor substrate of a first conductivity type. The stacked capacitor has a bottom plate. The bottom plate that is formed by a lightly doped well diffused into the surface of the semiconductor substrate. The bottom plate also has a first plurality of interconnected conductive layers of a first conductive material disposed above and aligned with the well, whereby a first conductive layer of the first plurality of conductive layers is connected to the well by multiple contacts distributed over an area of the well.

The stacked capacitor of this invention further has a top plate. The top plate has a second conductive layer placed between the well and the first conductive layer. The second conductive layer of a second conductive material such as a highly doped polycrystalline silicon. The second conductive layer, has openings distributed over a surface area of the conductive material to allow the multiple contacts to connect the well and the first conductive layer. The top plate further has second plurality of interconnected conductive layers of the first conductive material connected to the second conductive layer and interleaved between each layer of the first plurality of conductive layers.

Additionally the stacked capacitor of this invention has a dielectric having a plurality of insulating layers of a material such as silicon dioxide to electrically isolate the well from the second conductive layer, the second conductive layer from the first conductive layer, and the first plurality of interconnected conductive layers from the second plurality of interconnected conductive layers.

The multiple contacts have contact diffusions of a material the second conductivity type diffused to a heavily doped concentration, a contact alloy formed through the openings in the second conductive layer to connect the first conductive layer to the contact diffusions. The multiple contacts decrease the resistivity of the well to prevent depletion of charges present in the well at a voltage well above the normal operating voltage of the stacked capacitor to some extent. Further, the multiple contacts allow for better high frequency operation, as well.

The first and second plurality of conductive layers are normally a metal such as aluminum, but may be fabricated of any conductive material.

BRIEF DESCRIPTION OF THE DRAWINGS

FIGS. 1a and 1b illustrate the structure of an integrated circuit capacitor formed on the surface of a semiconductor substrate by two levels of metal of the prior art.

FIGS. 1c and 1d illustrate the structure of an integrated circuit capacitor formed on the surface of a semiconductor substrate by a highly doped polycrystalline silicon and a level of metal of the prior art.

FIG. 1e illustrates a cross-sectional view of the structure of a stacked capacitor formed on the surface of a semiconductor substrate of the prior art.

FIG. 2 is a cross-sectional view of the structure of a capacitor formed on the surface of a semiconductor substrate by a highly doped polycrystalline silicon level and doped well of the prior art.

DETAILED DESCRIPTION OF THE INVENTION

Figure 3:
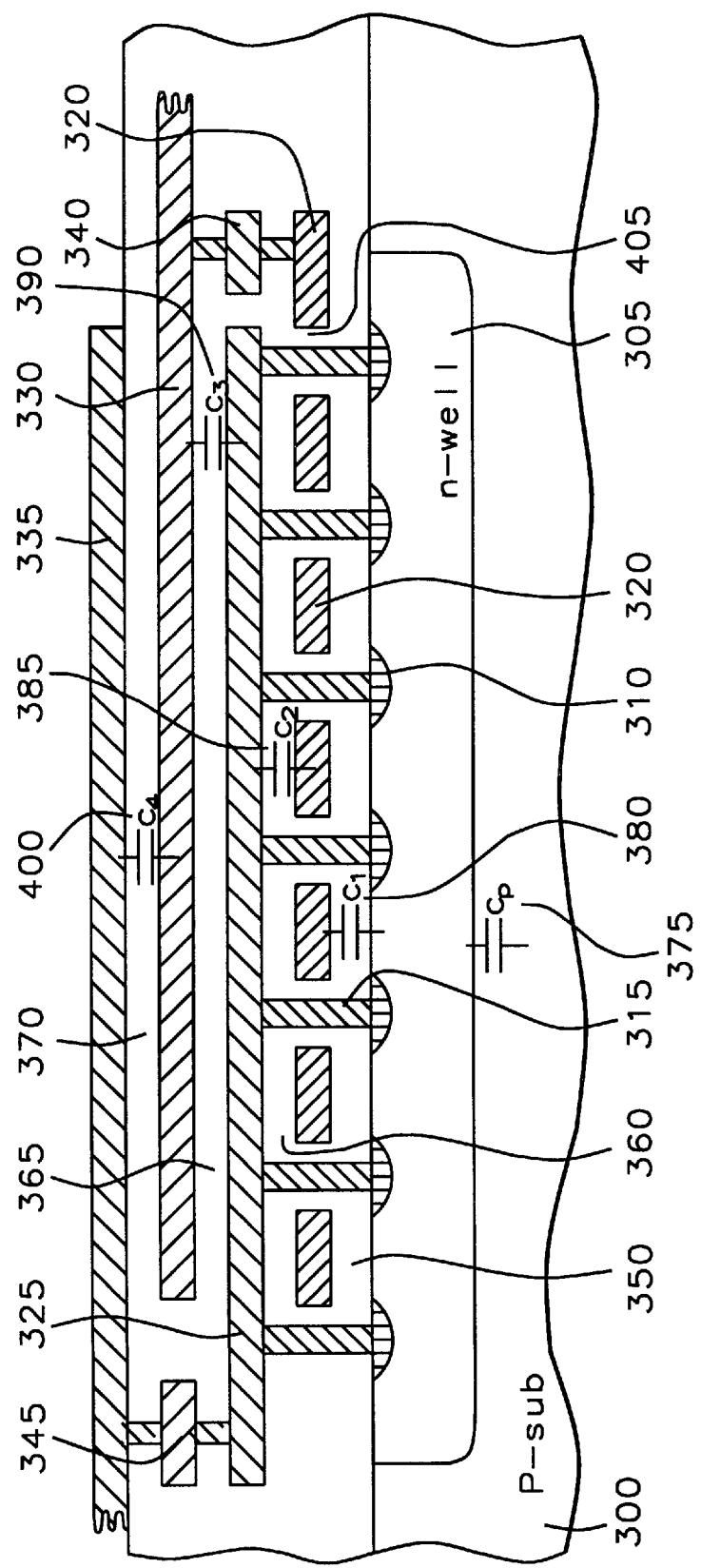
FIG. 3 is a cross-sectional view of the structure of a stacked capacitor formed on the surface of a semiconductor substrate of this invention.
Figure 4:
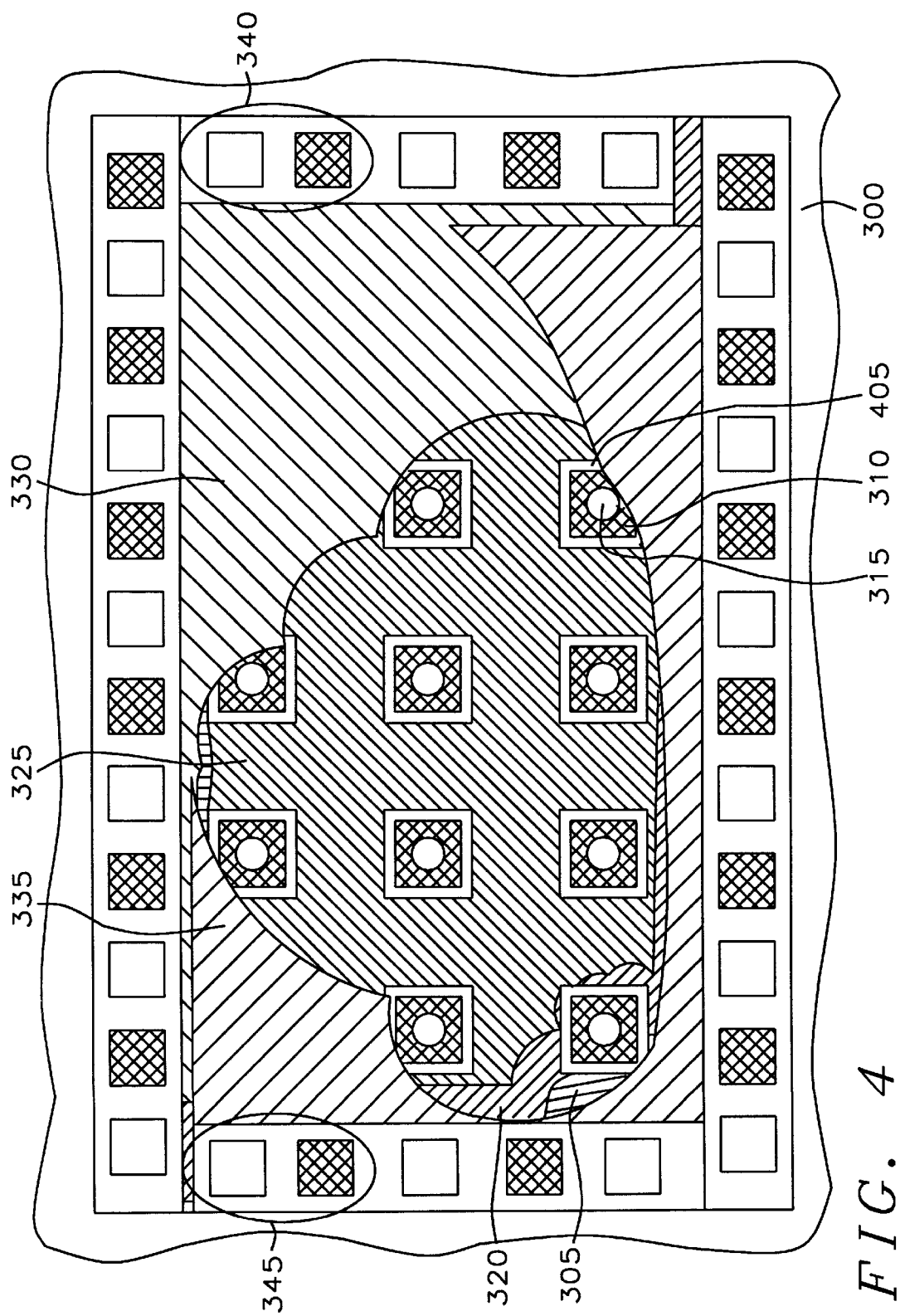
FIG. 4 is a plan view of the structure of a capacitor formed on the surface of a semiconductor substrate of this invention.

Refer now to FIGS. 3 and 4 for an explanation of the structure and method of formation of the stacked capacitor of this invention. An n-type material is diffused to low concentration into the surface of a p-type semiconductor substrate 300 to form the n-well 305. The n-type material is further diffused to a high concentration to form the n-type contacts 310. The n-type contacts 310 are distributed uniformly throughout the area of the n-well 305. This arrangement decreases the resistivity of n-well 305 and to some extent prevents depletion in the n-well 305 of the charges described above.

An insulating material such as silicon dioxide is formed on the surface of the semiconductor substrate 300 to form the first insulating layer 350. A highly doped polycrystalline silicon layer 320 is formed on the surface of the first insulating layer 350. Openings 405 are made in the highly doped polycrystalline silicon layer 320. A second insulating layer 360 is formed of an insulating material such as silicon dioxide on the highly doped polycrystalline silicon layer 320.

Contact metallurgy 315 is deposited in the openings 405 to connect the n- type contacts 310 to the first level metal layer 325. The first level metal layer 325 is deposited on the second insulating layer 360.

The second level metal layer 330 and the third level metal layer 335 are formed over first level metal layer 325. The first, second, and third level metal layers 325, 330, and 335 are separated by the third insulating layer 365 and fourth insulating layer 370 formed of an insulating material such as silicon dioxide.

The via 345 is formed in openings of the third and fourth insulating layers 365 and 370 to connect the third level metal 335 to the first level metal 325 and thus form the bottom plate of the capacitor with the n-well 305. The via 340 is formed in openings in the second and third insulating layers 360 and 365 to connect the highly doped polycrystalline silicon layer 320 to the second level metal layer 325 and thus form the top plate of the capacitor.

The n-well 305, the highly doped polycrystalline silicon layer 320, and the first insulating layer 350 constitute the capacitor Cl 380. The highly doped polycrystalline silicon layer 320, the second insulating layer 360, and the first level metal layer 325 constitute the capacitor C2 385. The first level metal layer 325, the third insulating layer 365, and the second level metal layer 330 constitute the capacitor C3 390. And the second level metal layer 330, the fourth insulating layer 370, and the third level metal layer 335 constitute the capacitor C4 400. The capacitance of the stacked capacitor is the sum of the capacitance of the capacitors Cl, C2, C3, and C4.

The first insulating layer 350 is a field oxide that is generally thinner than the second, third, and fourth insulating layers 360, 365, and 370, which are generally interlayer oxides. The thinner field oxide of the first insulating layer 350 causes the capacitor C1 to have a capacitance of approximately 1.0 $fF/\mu m^2$. However, the field oxide of the first insulating layer 350 is thick enough to prevent depletion of the n-well 305 at normal voltage levels of the power supply voltage source as would happen if the first insulating layer 350 were a gate oxide as described above as the thin insulating layer 215 of FIG. 2. Therefore, the voltage coefficient (Kv) is relatively very small and the capacitance per unit area is relatively high for this capacitor.

Table 3 illustrates the range of thickness of a currently typical 0.35 $\mu m$ process.

TABLE 2

| Insulating Layer | Range of Thickness |
| --- | --- |
| Gate oxide 215 of FIG. 2 | 6.3 nanometers to 7.7 nanometers |
| Field Oxide First Insulating Layer 350 | 280 nanometers to 420 nanometers |
| Polysilicon to Metal 1 Second Insulating Layer 360 | 460 nanometers to 690 nanometers |
| Metal 1 to Metal 2 Third Insulating Layer 365 | 690 nanometers to 1030 nanometers |
| Metal 2 to Metal 3 Fourth Insulating Layer 370 | 690 nanometers to 1030 nanometers |

The parasitic capacitor Cp 375 is formed at the junction of the n-well 305 and the p-type substrate 300. The parasitic capacitance factor (Kp) in such case is equal 1.0 and the capacitance per unit area is quite high on the order of 0.24 $fF/\mu m^2$.

It is apparent to those skilled in the art that the first, second, and third level metal layers 325, 330, 335 are generally aluminum. However, other metals or highly doped semiconductors as employed in semiconductor fabrication as interconnecting wiring are in keeping with the intent of this invention. Further, it is apparent that the highly doped polycrystalline silicon layer 320 could also be any metal or other highly conductive semiconductor material employed in semiconductor fabrication. Similarly, the first, second, third, and fourth insulating layers 350, 360, 365, 370 may have the silicon dioxide substituted with insulating films such as silicon nitride $Si_xN_y$, silicon oxynitride $Si_xO_yN_z$, polyimide, or other insulating films employed in semiconductor fabrication.

The embodiment described for this invention shows three levels of metal and one level of highly doped polycrystalline silicon and an n-well interleaved to form the top plate and the bottom plate of the capacitor. It is apparent that any number of layers of conductive material, metal or highly doped semiconductor, can be interleaved with alternate layers interconnected to form the stacked capacitor of this invention.

While this invention has been particularly shown and described with reference to the preferred embodiments thereof, it will be understood by those skilled in the art that various changes in form and details may be made without departing from the spirit and scope of the invention.

The invention claimed is:

1. A method for fabricating a stacked capacitor at the surface of a semiconductor substrate, comprising the steps of:

diffusing a material of a first conductivity type to a lightly doped concentration into the surface of the semiconductor substrate to form a diffusion well; diffusing the material of the first conductivity type to a highly doped concentration into the surface of the semiconductor substrate within the well to form a plurality of contacts distributed within said well, whereby the plurality of contacts decrease the resistivity of the well to prevent depletion of charges present in said well;

forming a first insulating layer on the surface of said semiconductor substrate;

forming a first conductive layer of a first conductive material upon said first insulating layer aligned with said diffusion well;

forming contact openings in the first insulating layer and the first conductive layer aligned with and above the plurality of contacts;

forming a second insulating layer on the first conductive layer;

reforming the contact openings in the second insulating layer aligned with the plurality of contacts and isolated from the first conductive layer to re-expose said plurality of contacts;

placing a contact material within said openings to connect to the plurality of contacts;

forming a second conductive layer of a second conductive material on the second insulating layer in connection with the contact material;

forming a first plurality of conductive layers of the second conductive material aligned with and connected through at least one first interlayer via to the first conductive layer;

forming a second plurality of conductive layers of the second conductive material aligned with and connected through at least one second interlayer via to the second conductive layer, whereby each layer of the second plurality is interleaved between two layers of the first plurality of conductive layers; and forming a plurality of insulating layers between each layer of the first and second plurality of conductive layers.

2. The method of claim 1 wherein the first conductive material is highly doped polycrystalline silicon.

3. The method of claim 1 wherein the second conductive material is metal.

4. The method of claim 1 wherein the first insulating layer, second insulating layer and the plurality of insulating layers is silicon dioxide.

5. The method of claim 1 wherein the first insulating layer has a thickness to create a capacitance between said diffusion well and said first conductive layer of approximately 0.1 fF/$\mu$m$^2$.

* * * * *